(12) United States Patent
Han

(10) Patent No.: US 11,315,996 B2
(45) Date of Patent: Apr. 26, 2022

(54) DISPLAY PANEL AND MANUFACTURING METHOD OF THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Baixiang Han, Shenzhen (CN)

(*) Notice: Subject to any disclaimer, the term of this patent is extended or adjusted under 35 U.S.C. 154(b) by 252 days.

(21) Appl. No.: 16/621,259

(22) PCT Filed: Sep. 10, 2019

(86) PCT No.: PCT/CN2019/105149
§ 371 (c)(1),
(2) Date: Dec. 11, 2019

(87) PCT Pub. No.: WO2020/224143
PCT Pub. Date: Nov. 12, 2020

(65) Prior Publication Data
US 2021/0327984 A1     Oct. 21, 2021

(30) Foreign Application Priority Data

May 8, 2019 (CN) .......................... 201910379388.3

(51) Int. Cl.
| H01L 29/12 | (2006.01) |
| H01L 27/32 | (2006.01) |
| H01L 51/56 | (2006.01) |
| H01L 27/12 | (2006.01) |

(52) U.S. Cl.
CPC ...... *H01L 27/3262* (2013.01); *H01L 27/3265* (2013.01); *H01L 51/56* (2013.01); *H01L 27/1251* (2013.01); *H01L 2227/323* (2013.01)

(58) Field of Classification Search
CPC ............. H01L 27/3262; H01L 27/3265; H01L 27/1251; H01L 2227/323; H01L 51/56
USPC .......................................................... 257/71
See application file for complete search history.

(56) References Cited

U.S. PATENT DOCUMENTS

| 2016/0071916 | A1 | 3/2016 | Kim et al. |
| 2016/0322441 | A1 | 11/2016 | Kim et al. |
| 2017/0098686 | A1* | 4/2017 | Jeong ................... H01L 27/3262 |
| 2018/0012948 | A1* | 1/2018 | Lee ...................... H01L 27/1218 |

(Continued)

FOREIGN PATENT DOCUMENTS

| CN | 104752426 A | 7/2015 |
| CN | 105895655 A | 8/2016 |

(Continued)

*Primary Examiner* — Phuc T Dang

(57) ABSTRACT

A display panel and a method of manufacturing thereof are provided. The display panel includes a first thin film transistor and a second thin film transistor connected in parallel, a storage capacitor, and a light emitting structure. A projection of the first thin film transistor on a light emitting surface of the display panel overlaps with a projection of the second thin film transistor on the light emitting surface of the display panel. The storage capacitor is located below the light emitting structure, and a projection of the storage capacitor on the light emitting surface of the display panel overlaps with a projection of the light emitting structure on the light emitting surface of the display panel.

13 Claims, 2 Drawing Sheets

(56) References Cited

U.S. PATENT DOCUMENTS

2018/0219032 A1    8/2018  Lou et al.
2018/0337288 A1*  11/2018  Shin .................... G09G 3/3233

FOREIGN PATENT DOCUMENTS

CN      107452757  A    12/2017
KR      102056275  B1    1/2020

* cited by examiner

DISPLAY PANEL AND MANUFACTURING METHOD OF THEREOF

CROSS REFERENCE TO RELATED APPLICATION

This application claims the priority of International Application No. PCT/CN2019/105149, filed on 2019 Sep. 10, which claims priority to Chinese Application No. 201910379388.3, filed on 2019 May 8. The entire disclosures of each of the above applications are incorporated herein by reference.

BACKGROUND OF INVENTION

Field of Invention

The present invention relates to the field of electronic display, and in particular, to a display panel and a method of manufacturing thereof.

Description of Prior Art

3T1C pixel driver circuit is the most commonly used driver circuit in OLED display panels. FIG. 1 and FIG. 2 are respectively a circuit diagram and a structural diagram of a 3T1C pixel driving circuit in the prior art.

Technical Problems

In the prior art, thin film transistors and storage capacitors all contain an opaque metal material, thus a light emitting diode 020 can only be disposed in a metal escaping region. That is, a driving thin film transistor 010, a first thin film transistor 011, a second thin film transistor 012, a storage capacitor 030, and a light emitting diode 020 are arranged side by side, and their projections on a horizontal plane do not overlap with each other. Such an arrangement results in a large layout area occupied by each driving circuit. On one hand, a resolution of the display panel cannot be improved. On the other hand, an aperture ratio of the display panel is also constrained, and leads to a poor display effect.

SUMMARY OF INVENTION

The present application provides a display panel and a method of manufacturing thereof to improve aperture ratio and resolution of a bottom emitting display panel.

In order to solve the above problems, the present application provides a display panel, comprising a first thin film transistor and a second thin film transistor, a storage capacitor, and a light emitting structure connected in parallel;

wherein a projection of the first thin film transistor on a light emitting surface of the display panel overlaps with a projection of the second thin film transistor on a light emitting surface of the display panel;

wherein the light emitting structure is electrically connected to the first thin film transistor or the second thin film transistor, and a projection of the light emitting structure on the light emitting surface of the display panel separates from projections of the first thin film transistor and the second thin film transistor on the light emitting surface of the display panel;

wherein the storage capacitor is located below the light emitting structure, a projection of the storage capacitor on the light emitting surface of the display panel overlaps with the projection of the light emitting structure on the light emitting surface of the display panel.

According to one aspect of the application, wherein the parallel first thin film transistor and second thin film transistor share a same metal gate.

According to one aspect of the application, wherein the first thin film transistor is a top gate type thin film transistor comprising a first active region and a first source/drain metal, the first active region and the first source/drain metal are located on both sides of the metal gate.

According to one aspect of the application, wherein the first thin film transistor comprises:

a substrate, the first active region is located on the substrate;

a first gate dielectric layer disposed on the first active region, and the metal gate is disposed on the first gate dielectric layer;

a first interlayer dielectric layer covering the first active region and the metal gate;

wherein the first source/drain metal is located on the first interlayer dielectric layer and is electrically connected to the first active region through a first via hole penetrating the first interlayer dielectric layer.

According to one aspect of the application, a back gate type thin film transistor comprising a second active region and a second source/drain metal, and the second active region and the second source/drain metal are located on a same sides of the metal gate.

According to one aspect of the application, wherein the second thin film transistor comprises:

a second gate dielectric layer located on the metal gate;

a second active region located on the second gate dielectric layer;

a second interlayer dielectric layer covering the second active region;

wherein the second source/drain metal is located on the second interlayer dielectric layer and is electrically connected to the second active region through a second via hole penetrating the second interlayer dielectric layer.

According to one aspect of the application, wherein an anode of the light emitting structure is a transparent electrode, and a cathode of the light emitting structure is a reflective electrode.

According to one aspect of the application, wherein a first plate of the storage capacitor is spaced apart from the first active region of the first thin film transistor, and a material constituting the first plate is same as a material constituting the first active region.

According to one aspect of the application, wherein a second plate of the storage capacitor is spaced apart from the second active region of the second thin film transistor, and a material constituting the second plate is same as a material constituting the second active region.

The present application further provides a method of manufacturing a display panel, wherein the method comprises the following steps:

providing a substrate;

forming a first active region of a first thin film transistor and a first plate of a storage capacitor on the substrate;

forming a first gate dielectric layer on the first active region;

forming a metal gate on the first gate dielectric layer;

forming a first interlayer dielectric layer covering the metal gate, the first active region, and the first plate;

forming a second active region of a second thin film transistor and a second plate of the storage capacitor on the first interlayer dielectric layer;

forming a second interlayer dielectric layer covering the second active region and the second plate;

forming a first source/drain metal electrically connected to the first active region and penetrating through the first interlayer dielectric layer and the second interlayer dielectric;

forming a second source/drain metal electrically connected to the second active region and penetrating through the second interlayer dielectric layer;

forming a planarization layer covering the first source/drain metal and the second source/drain metal;

forming a light emitting structure on the planarization layer.

According to one aspect of the application, wherein a projection of the first active region on the substrate completely covers a projection of the second active region on the substrate.

According to one aspect of the application, wherein the first plate and the second plate of the storage capacitor have a same area.

According to one aspect of the application, wherein a projection of the first plate of the storage capacitor on the substrate overlaps with a projection of the second plate on the substrate.

According to one aspect of the application, wherein a projection of the light emitting structure on the substrate overlaps with a projection of the first plate on the substrate.

According to one aspect of the application, wherein the method of forming the light emitting structure comprises the steps of:

forming an anode on the planarization layer, the anode electrically connected to the first thin film transistor or the second thin film transistor;

forming a pixel defining layer covering the planarization layer, the pixel defining layer having an opening exposing the anode;

forming a light emitting material in the opening;

forming a cathode covering the light emitting material.

Beneficial Effects

Compared with bottom emitting display panels in the prior art, the present application stacks two transistors of the 3T1C pixel driving circuit to save an area of a transistor. At the same time, a storage capacitor is disposed under a light emitting structure to increase an aperture ratio of the pixel. Meanwhile, the storage capacitor of the display panel in the present application is simultaneously formed with active regions of the two stacked thin film transistors, therefore, the present application optimizes a device structure without increasing the complexity of the process, and greatly improves the performance of the bottom emitting display panel in the prior art.

DETAILED DESCRIPTION OF PREFERRED EMBODIMENTS

Figure 1:
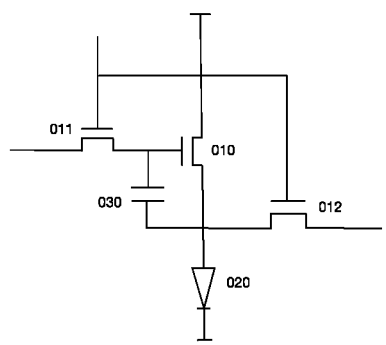
FIG. 1 is a circuit diagram of a 3T1C pixel driving circuit in the prior art.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

Figure 2:
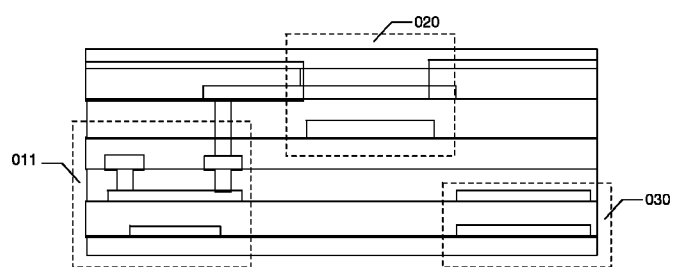
FIG. 2 is a structural diagram of a part of components of the 3T1C pixel driving circuit of FIG. 1.

First, the prior art will be briefly described. Referring to FIG. 1 and FIG. 2, FIG. 1 is a circuit diagram of a 3T1C pixel driving circuit in the prior art, and FIG. 2 is a structural diagram of some components of the 3T1C pixel driving circuit in FIG. 1. The 3T1C pixel driving circuit in the prior art includes a driving thin film transistor 010, a light emitting structure 020, a first thin film transistor 011, a second thin film transistor 012, and a storage capacitor 030. Since the thin film transistors and the storage capacitor contain an opaque metal material, the light emitting diode 020 can only be disposed in a metal escaping region.

Referring to FIG. 2, the first thin film transistor 011, the light emitting structure 020, and the storage capacitor 030 are arranged side by side. Similarly, the driving thin film transistor 010 and the second thin film transistor 012 not shown in FIG. 2 are also arranged in parallel with the light emitting structure 020. Projections of the first thin film transistor 011, the second thin film transistor 011, the third thin film transistor 012, the storage capacitor 030, and the light emitting diode 020 on a horizontal plane do not overlap with each other. Such an arrangement results in a large layout area occupied by each of the driving circuits. On one hand, a resolution of the display panel cannot be improved. On the other hand, an aperture ratio of the display panel is also constrained, and leads to a poor display effect.

Thus, the present application provides a display panel and a method of manufacturing thereof to improve aperture ratio and resolution of a bottom emitting display panel.

Figure 7:
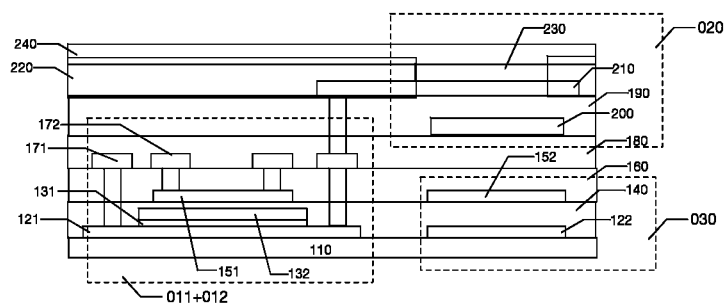
FIG. 7 is a structural diagram of a 3T1C pixel driving circuit in an embodiment of the present application after a light emitting structure is formed.
Figure 8:
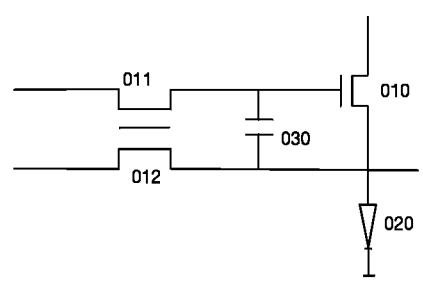
FIG. 8 is a circuit diagram of the 3T1C pixel driving circuit of FIG. 7.

Referring to FIG. 7 and FIG. 8, FIG. 7 is a structural diagram of a 3T1C pixel driving circuit in an embodiment of the present application after a light emitting structure is formed. FIG. 8 is a circuit diagram of the 3T1C pixel driving circuit of FIG. 7.

The display panel includes a first thin film transistor 011 and a second thin film transistor 012 connected in parallel, a driving thin film transistor 010, a storage capacitor 030, and a light emitting structure 020.

A projection of the first thin film transistor 011 on a light emitting surface of the display panel overlaps with a projection of the second thin film transistor 012 on the light emitting surface of the display panel. The light emitting structure 020 is electrically connected to the first thin film transistor 011 or the second thin film transistor 012, and a projection of the light emitting structure 020 on the light emitting surface of the display panel does not overlap with projections of the first thin film transistor 011 and the second thin film transistor 012 on the light emitting surface of the display panel. The storage capacitor 030 is located below the light emitting structure 020, a projection of the storage capacitor 030 on the light emitting surface of the display panel overlaps with the projection of the light emitting structure 020 on the light emitting surface of the display panel.

Referring to FIG. 7, the parallel first thin film transistor 011 and the second thin film transistor 012 share a same metal gate 132.

In this embodiment, the first thin film transistor 011 is a top gate thin film transistor. The first thin film transistor 011 includes a first active region 121 and a first source/drain metal 171, and the first active region 121 and the first source/drain metal 171 are located on both sides of the metal gate 132.

In this embodiment, the first thin film transistor 011 further includes: a substrate 110, a first gate dielectric layer 131, and a first interlayer dielectric layer 140.

The first active region 121 is located on the substrate 110. The first gate dielectric layer 131 is located on the first active region 121, and the metal gate 132 is located on the first gate dielectric layer 131. The first interlayer dielectric layer 140 covers the first active region 121 and the metal gate 132. The first source/drain metal 171 is located on the first interlayer dielectric layer 140 and electrically connected to the first active region 121 through a first via hole penetrating the first interlayer dielectric layer 140.

In this embodiment, the second thin film transistor 012 is a back gate thin film transistor. The second thin film transistor 012 includes a second active region 151 and a second source/drain metal 172, and the second active region 151 and the second source/drain metal 172 are located on a same side of the metal gate 132.

In this embodiment, the second thin film transistor 012 further includes: a second gate dielectric layer, the second active region 151, and a second interlayer dielectric layer 160. The second gate dielectric layer is on the metal gate 132. In the embodiment, the second interlayer dielectric layer 160 covers the second active region 151, and a top of the second interlayer dielectric layer 160 is higher than a top of the second active region 151. Therefore, in the embodiment, the second interlayer dielectric layer 160 is used as the second gate dielectric layer. The second active region 151 is located on the second interlayer dielectric layer 160. The second source/drain metal 172 is located on the second interlayer dielectric layer 160 and is electrically connected to the second active region 151 through a second via hole penetrating the second interlayer dielectric layer 160.

Referring to FIG. 7, in the embodiment, a first plate 122 of the storage capacitor 030 is spaced apart from the first active region 121 of the first thin film transistor 011. A material constituting the first plate 122 is same as a material constituting the first active region 121. The second plate 152 of the storage capacitor 030 is spaced apart from the second active region 151 of the second thin film transistor 012, and a material constituting the second plate is same as a material constituting the second active region 151. A projection of the first plate 122 on the substrate 110 overlaps with a projection of the second plate 152 on the substrate 110. Moreover, in the present embodiment, in order to save as much area as possible, a projection of the light emitting structure 020 on the substrate 110 overlaps with the projection of the first plate 122 on the substrate 110.

Referring to FIG. 7, in the embodiment, the light emitting structure 020 is an organic light emitting diode, and includes an anode 210, a pixel defining layer 220, a light emitting material 230, a cathode 240, and a color film layer 200.

The light emitting material 230 in this embodiment is a white light emitting material. Therefore, there is also need to provide a color film layer of different colors under the light emitting material to convert white light into light of other colors, such as red, blue, and green. In other embodiments, the light emitting material may also be a red light emitting material, a green light emitting material, and a blue light emitting material. In that case, it would be unnecessary to provide a color film layer.

In this embodiment, the anode 210 is a transparent electrode such as indium tin oxide or other transparent conductive material. The color film layer 200 is located above the second interlayer dielectric layer 160. In this embodiment, the light emitting structure 020 further includes a protective layer 190 covering the color film layer 200.

The pixel defining layer 220 is located on the protective layer 190 and has an opening exposing the anode 210. The light emitting material 230 is located in the opening. The cathode 240 covers the light emitting material 230, and the cathode 240 of the lighting emitting structure 020 is a reflective electrode.

Compared with bottom emitting display panels in the prior art, the present application stacks two transistors of the 3T1C pixel driving circuit to save an area of a transistor. At the same time, a storage capacitor 030 is disposed under a light emitting structure 020 to increase an aperture ratio of the pixel. Meanwhile, the storage capacitor 030 of the display panel in the present application is simultaneously formed with active regions of the two stacked thin film transistors, therefore, the present application optimizes a device structure without increasing the complexity of the process, and greatly improves the performance of the bottom emitting display panel in the prior art.

Referring to FIG. 3 to FIG. 7, the present application further provides a method for manufacturing a display panel, which will be described in detail below with reference to the accompanying drawings.

Figure 3:
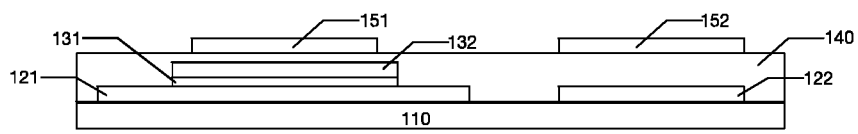
FIG. 3 is a structural diagram of a 3T1C pixel driving circuit in an embodiment of the present application after an active region is formed.

First, as shown in FIG. 3, providing a substrate 110, and forming a first active region 121 of a first thin film transistor 011 and a first plate 122 of a storage capacitor 030 on the substrate 110. Thereafter, forming a first gate dielectric layer 131 on the first active region 121, and forming a metal gate 132 on the first gate dielectric layer 131. Then, forming a first interlayer dielectric layer 140 covering the metal gate 132, the first active region 121, and the first plate 122. Then, forming a second active region 151 of the second thin film transistor 012 and a second plate 152 of the storage capacitor 030 on the first interlayer dielectric layer 140.

Figure 4:
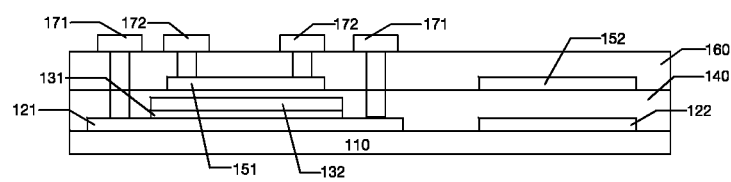
FIG. 4 is a structural diagram of a 3T1C pixel driving circuit in an embodiment of the present application after a source/drain trace layer is formed.

Thereafter, referring to FIG. 4, forming a second interlayer dielectric layer 160 covering the second active region 151 and the second plate 152. Thereafter, forming a first source/drain metal 171 electrically connected to the first active region 121 penetrating the first interlayer dielectric layer 140 and the second interlayer dielectric layer. Thereafter, forming a second source/drain metal 172 electrically connected to the second active region 151 penetrating the second interlayer dielectric layer 160.

In this embodiment, the first thin film transistor 011 is a top gate thin film transistor, and the second thin film transistor 012 is a back gate thin film transistor. The first thin film transistor 011 and the second thin film transistor 012 share a same metal gate. This setting effectively reduces an area of the non-light emitting area of the pixel driving circuit, and effectively increases the aperture ratio of the pixel.

Figure 5:
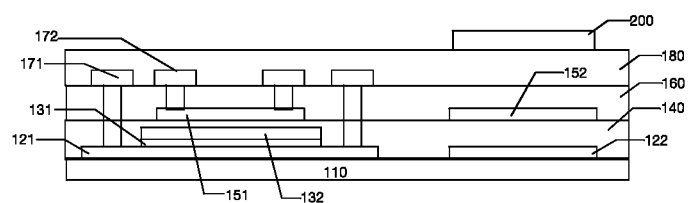
FIG. 5 is a structural diagram of a 3T1C pixel driving circuit in an embodiment of the present application after a filter is formed.
Figure 6:
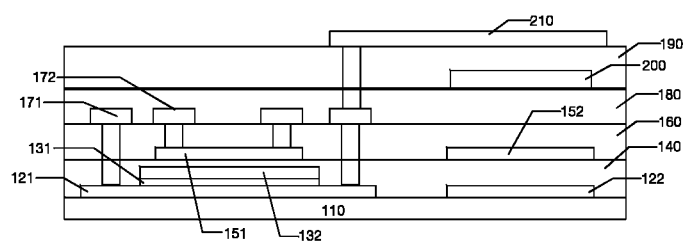
FIG. 6 is a structural diagram of a 3T1C pixel driving circuit in an embodiment of the present application after an anode is formed.

Thereafter, referring to FIG. 5, forming a planarization layer 180 covering the first source/drain metal 171 and the second source/drain metal 172. Since the light emitting material 230 in this embodiment is a white light emitting material, a color film layer 200 of different colors also needs to be provided under the light emitting material to convert white light into light of other colors, such as red light, blue light, and green light. Thereafter, forming a protective layer 190 covering the color film layer 200 as shown in FIG. 6.

In this embodiment, the anode 210 is a transparent electrode such as indium tin oxide or other transparent conductive material. The color film layer 200 is located above the planarization layer 180. The first plate 122 of the storage capacitor 030 is spaced apart from the first active region 121 of the first thin film transistor 011. A material constituting the first plate 122 is the same as a material constituting the first active region 121. The second plate 152 of the storage capacitor 030 is spaced apart from the second active region 151 of the second thin film transistor 012, a material constituting the second plate is the same as a material constituting the second active region 151. A projection of the first plate 122 on the substrate 110 overlaps with a projection of the second plate 152 on the substrate 110. Moreover, in the present embodiment, in order to save as much area as possible, a projection of the light emitting structure 020 on the substrate 110 overlaps with the projection of the first plate 122 on the substrate 110.

According to one aspect of the application, a projection of the first active region 121 on the substrate 110 completely covers a projection of the second active region 151 on the substrate 110.

According to one aspect of the application, the first plate 122 and the second plate 152 of the storage capacitor 030 have a same area.

According to one aspect of the application, a projection of the first plate 122 of the storage capacitor 030 on the substrate 110 overlaps with a projection of the second plate 152 on the substrate 110.

According to one aspect of the application, a projection of the light emitting structure 020 on the substrate 110 overlaps with a projection of the first plate 122 on the substrate 110.

Last, as shown in FIG. 6 and FIG. 7, forming a light emitting structure 020 on the planarization layer 180. The method of forming the light emitting structure 020 comprises the following steps.

Forming an anode 210 on the planarization layer 180, the anode 210 is electrically connected to the first thin film transistor 011 or the second thin film transistor 012.

Forming a pixel defining layer 220 covering the planarization layer 180, the pixel defining layer 220 having an opening exposing the anode 210.

Forming a light emitting material 230 in the opening.

Forming a cathode 240 covering the light emitting material.

Compared with bottom emitting display panels in the prior art, the present application stacks two transistors of the 3T1C pixel driving circuit to save an area of a transistor. At the same time, a storage capacitor is disposed under a light emitting structure to increase an aperture ratio of the pixel. Meanwhile, the storage capacitor of the display panel in the present application is simultaneously formed with active regions of the two stacked thin film transistors; therefore, the present application optimizes a device structure without increasing the complexity of the process, and greatly improves the performance of the bottom emitting display panel in the prior art.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display panel comprising a first thin film transistor and a second thin film transistor connected in parallel, a storage capacitor, and a light emitting structure;
    wherein a projection of the first thin film transistor on a light emitting surface of the display panel overlaps with a projection of the second thin film transistor on the light emitting surface of the display panel;
    wherein the light emitting structure is electrically connected to the first thin film transistor or the second thin film transistor, and a projection of the light emitting structure on the light emitting surface of the display panel does not overlap with the projections of the first thin film transistor and the second thin film transistor on the light emitting surface of the display panel; and
    wherein the storage capacitor is located below the light emitting structure, and a projection of the storage capacitor on the light emitting surface of the display panel overlaps with the projection of the light emitting structure on the light emitting surface of the display panel,
    wherein the first thin film transistor and the second thin film transistor connected in parallel share a same metal gate, and the first thin film transistor is a top gate type thin film transistor comprising a first active region and a first source/drain metal, and the first active region and the first source/drain metal are located on both sides of the metal gate.

2. The display panel according to claim 1, wherein the first thin film transistor comprises:
    a substrate, wherein the first active region is located on the substrate;
    a first gate dielectric layer disposed on the first active region, wherein the metal gate is disposed on the first gate dielectric layer; and
    a first interlayer dielectric layer covering the first active region and the metal gate;
    wherein the first source/drain metal is located on the first interlayer dielectric layer and is electrically connected to the first active region through a first via hole penetrating the first interlayer dielectric layer.

3. The display panel according to claim 1, wherein the second thin film transistor is a back gate type thin film transistor comprising a second active region and a second source/drain metal, and the second active region and the second source/drain metal are located on a same side of the metal gate.

4. The display panel according to claim 3, wherein the second thin film transistor comprises:
    a second gate dielectric layer located on the metal gate;
    a second active region located on the second gate dielectric layer; and
    a second interlayer dielectric layer covering the second active region;
    wherein the second source/drain metal is located on the second interlayer dielectric layer and is electrically connected to the second active region through a second via hole penetrating the second interlayer dielectric layer.

5. The display panel according to claim 3, wherein a second plate of the storage capacitor is spaced apart from the second active region of the second thin film transistor, and a material constituting the second plate is same as a material constituting the second active region.

6. The display panel according to claim 1, wherein an anode of the light emitting structure is a transparent electrode, and a cathode of the light emitting structure is a reflective electrode.

7. The display panel according to claim 1, wherein a first plate of the storage capacitor is spaced apart from the first active region of the first thin film transistor, and a material constituting the first plate is same as a material constituting the first active region.

8. A method of manufacturing a display panel, wherein the method comprises following steps:
providing a substrate;
forming a first active region of a first thin film transistor and a first plate of a storage capacitor on the substrate;
forming a first gate dielectric layer on the first active region;
forming a metal gate on the first gate dielectric layer;
forming a first interlayer dielectric layer covering the metal gate, the first active region, and the first plate;
forming a second active region of a second thin film transistor and a second plate of the storage capacitor on the first interlayer dielectric layer;
forming a second interlayer dielectric layer covering the second active region and the second plate;
forming a first source/drain metal electrically connected to the first active region and penetrating through the first interlayer dielectric layer and the second interlayer dielectric;
forming a second source/drain metal electrically connected to the second active region and penetrating through the second interlayer dielectric layer;
forming a planarization layer covering the first source/drain metal and the second source/drain metal; and
forming a light emitting structure on the planarization layer.

9. The method of manufacturing the display panel according to claim 8, wherein a projection of the first active region on the substrate completely covers a projection of the second active region on the substrate.

10. The method of manufacturing the display panel according to claim 8, wherein the first plate and the second plate of the storage capacitor have a same area.

11. The method of manufacturing the display panel according to claim 10, wherein a projection of the first plate of the storage capacitor on the substrate overlaps with a projection of the second plate on the substrate.

12. The method of manufacturing the display panel according to claim 11, wherein a projection of the light emitting structure on the substrate overlaps with the projection of the first plate on the substrate.

13. The method of manufacturing the display panel according to claim 8, wherein the method of forming the light emitting structure comprises steps of:
forming an anode on the planarization layer, wherein the anode is electrically connected to the first thin film transistor or the second thin film transistor;
forming a pixel defining layer covering the planarization layer, and the pixel defining layer having an opening exposing the anode;
forming a light emitting material in the opening; and
forming a cathode covering the light emitting material.

* * * * *